(12) United States Patent
Matsumoto et al.

(10) Patent No.: US 11,049,803 B2
(45) Date of Patent: Jun. 29, 2021

(54) SEMICONDUCTOR MODULE

(71) Applicant: Mitsubishi Electric Corporation, Tokyo (JP)

(72) Inventors: Takayuki Matsumoto, Fukuoka (JP); Yukimasa Hayashida, Fukuoka (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/638,071

(22) PCT Filed: Nov. 17, 2017

(86) PCT No.: PCT/JP2017/041524
§ 371 (c)(1),
(2) Date: Feb. 10, 2020

(87) PCT Pub. No.: WO2019/097685
PCT Pub. Date: May 23, 2019

(65) Prior Publication Data
US 2020/0185315 A1 Jun. 11, 2020

(51) Int. Cl.
| | |
|---|---|
| *H01L 23/495* | (2006.01) |
| *H01L 23/498* | (2006.01) |
| *H01L 23/31* | (2006.01) |
| *H01L 23/544* | (2006.01) |
| *H01L 23/00* | (2006.01) |
| *H01L 25/07* | (2006.01) |
| *H01L 25/18* | (2006.01) |

(52) U.S. Cl.
CPC .... *H01L 23/49838* (2013.01); *H01L 23/3121* (2013.01); *H01L 23/49811* (2013.01); *H01L 23/544* (2013.01); *H01L 24/32* (2013.01); *H01L 25/072* (2013.01); *H01L 25/18* (2013.01); *H01L 2223/54426* (2013.01); *H01L 2224/32227* (2013.01)

(58) Field of Classification Search
CPC . H01L 2223/54426; H01L 2224/32225; H01L 2224/32227; H01L 2224/48227; H01L 2224/83132; H01L 2224/85132; H01L 23/12; H01L 23/13; H01L 23/3121; H01L 23/3735; H01L 23/49811; H01L 23/49838; H01L 23/49894; H01L 23/544; H01L 24/32; H01L 24/48; H01L 24/73; H01L 24/83; H01L 24/85; H01L 25/072; H01L 25/16; H01L 25/18; H01L 2924/10253; H01L 2924/10254; H01L 2924/10272; H01L 2924/1033
See application file for complete search history.

(56) References Cited

FOREIGN PATENT DOCUMENTS

JP 2004241689 A 8/2004

OTHER PUBLICATIONS

International Search Report; Written Opinion; and Notification of Transmittal of the International Search Report and the Written Opinion of the International Searching Authority, or the Declaration issued in PCT/JP2017/041524; dated Jan. 23, 2018.

*Primary Examiner* — Robert G Bachner
(74) *Attorney, Agent, or Firm* — Studebaker & Brackett PC

(57) ABSTRACT

A semiconductor module includes: an insulating substrate; a metal pattern provided on the insulating substrate; a solder resist provided on the metal pattern; a semiconductor chip mounted on the metal pattern at an opening portion of the solder resist; and a sealing material sealing the metal pattern, the solder resist and the semiconductor chip, wherein a suction area surrounded by a groove is provided in a portion of the solder resist.

16 Claims, 2 Drawing Sheets

SEMICONDUCTOR MODULE

FIELD

The present invention relates to a semiconductor module.

BACKGROUND

In a semiconductor module for use in an electric railway and the like, a semiconductor chip and a terminal are soldered to a metal pattern on an insulating substrate. Traditionally, a metal pattern is sucked by a suction pad of a mounter when an insulating substrate is conveyed (see Patent Literature 1, for example).

CITATION LIST

Patent Literature

[PTL 1] JP 2004-241689 A

SUMMARY

Technical Problem

Since the suction pad is mainly made of silicone, the silicone of the suction pad volatilizes to generate siloxane gas. This siloxane gas is oxidized, so that the surface of the sucked metal pattern is contaminated with a $SiO_2$ film. As a result, the strength of a wire bond, a soldered joint or the like which is joined to the metal pattern deteriorates. In addition, the adhesion between the metal pattern contaminated with the $SiO_2$ film and a sealing material deteriorates, so that the sealing material may be peeled off, and the peeling may be extended to deteriorate the adhesion between a semiconductor chip and the sealing material. As a result, there has been a problem of a device failure.

An object of the present invention, which has been made to solve the above-described problem, is to obtain a semiconductor module that makes it possible to reduce occurrence of device failures.

Solution to Problem

A semiconductor module according to the present invention includes: an insulating substrate; a metal pattern provided on the insulating substrate; a solder resist provided on the metal pattern; a semiconductor chip mounted on the metal pattern at an opening portion of the solder resist; and a sealing material sealing the metal pattern, the solder resist and the semiconductor chip, wherein a suction area surrounded by a groove is provided in a portion of the solder resist.

Advantageous Effects of Invention

In the present invention, a suction area surrounded by a groove is provided in a portion of the solder resist. When the suction area is sucked by the suction pad, the surface of the suction area is contaminated with a $SiO_2$ film. However, the suction area which is part of the solder resist is not used for directly bonding a semiconductor chip or the like, and thus the contamination has less influence. Furthermore, even if the adhesion between the suction area and the sealing material deteriorates and thus the sealing material is peeled off, extension of the peeling is suppressed by the groove surrounding the suction area, so that the peeling is not likely to extend to the semiconductor chip. As a result, the occurrence of device failures can be reduced.

DESCRIPTION OF EMBODIMENTS

A semiconductor module according to the embodiments of the present invention will be described with reference to the drawings. The same components will be denoted by the same symbols, and the repeated description thereof may be omitted.

First Embodiment

Figure 1:
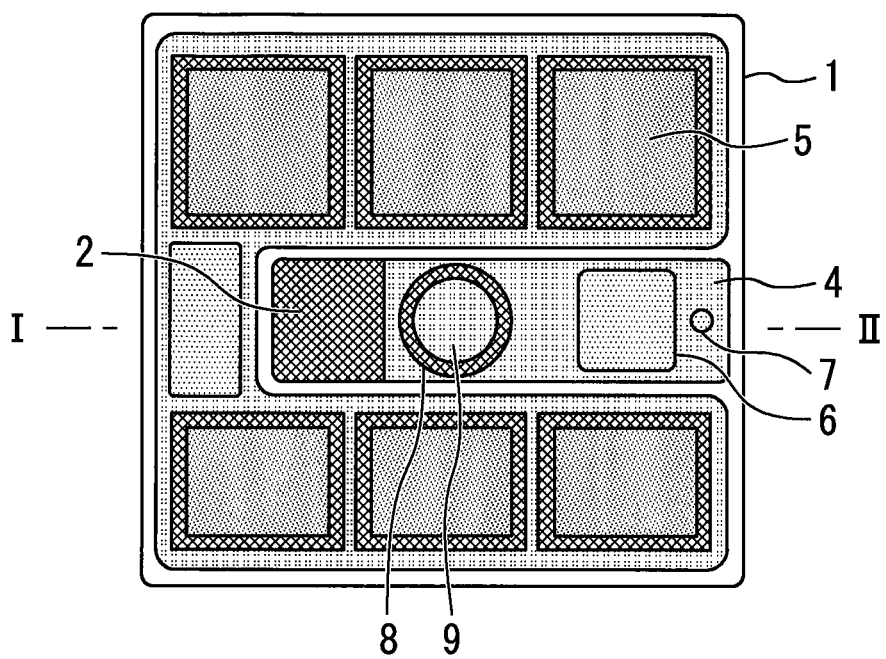
FIG. 1 is a plan view showing a semiconductor module according to a first embodiment.
Figure 2:
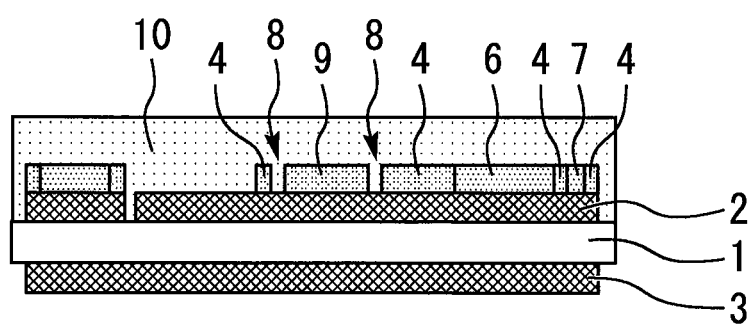
FIG. 2 is a cross-sectional view taken along I-II of FIG. 1.

FIG. 1 is a plan view showing a semiconductor module according to a first embodiment. FIG. 2 is a cross-sectional view taken along I-II of FIG. 1. An insulating substrate 1 is, for example, a ceramic substrate, and is provided with a metal pattern 2 on an upper surface thereof and a metal pattern 3 on a lower surface thereof.

A solder resist 4 for preventing solder leakage during soldering is provided on the metal pattern 2. A semiconductor chip 5 is mounted on the metal pattern 2 at an opening portion of the solder resist 4.

Terminal bonding plating 6 is provided on the metal pattern 2 excepting a mounting portion at which the semiconductor chip 5 is mounted. A position recognition mark 7 is provided to be adjacent to the terminal bonding plating 6. The position recognition mark 7 is plating or a hole, and is used for positioning when wire bonding is performed or when a terminal is bonded to the terminal bonding plating 6.

A circular sucked area 9 surrounded by a groove 8 is provided in a portion of the solder resist 4. The sucked area 9 is provided in the center of the insulating substrate 1. The diameter of the sucked area 9 is not less than 3 mm for being sucked by a suction pad. On the other hand, in order to save space, it is preferable that the diameter of the sucked area 9 is not more than 10 mm. Further, since the sucked area 9 is formed by cutting the groove 8 in the solder resist 4, the sucked area 9 and other portions of the solder resist 4 are made of the same material, and have the same film thickness.

When the insulating substrate 1 is conveyed, the sucked area 9 is sucked by the suction pad. By enclosing the sucked area 9 with the groove 8, the sucked area 9 can be visually easily identified. Therefore, the insulating substrate 1 can be automatically conveyed by the mounter, so that workability is enhanced and occurrence of defects caused by human factors can be reduced. Note that the adhesion between the solder resist 4 and the metal pattern 2 is high, and thus the sucked area 9 is prevented from being peeled off even though the sucked area 9 is sucked to lift up the insulating substrate 1. After the insulating substrate 1 is conveyed, the metal pattern 2, the solder resist 4 and the semiconductor chip 5 are sealed with a sealing material 10.

As described above, in the present embodiment, the sucked area 9 surrounded by the groove 8 is provided in part of the solder resist 4. Sucking the sucked area 9 by the suction pad contaminates the surface of the sucked area 9 with a $SiO_2$ film. However, the sucked area 9 which is part of the solder resist 4 is not used for directly bonding a semiconductor chip or the like, and thus the contamination has less influence. Furthermore, even if the adhesion between the sucked area 9 and the sealing material 10 deteriorates and thus the sealing material 10 is peeled off, extension of the peeling is suppressed by the groove 8 surrounding the sucked area 9, so that the peeling is not likely to extend to the semiconductor chip 5. As a result, the occurrence of device failures can be reduced.

Second Embodiment

Figure 3:
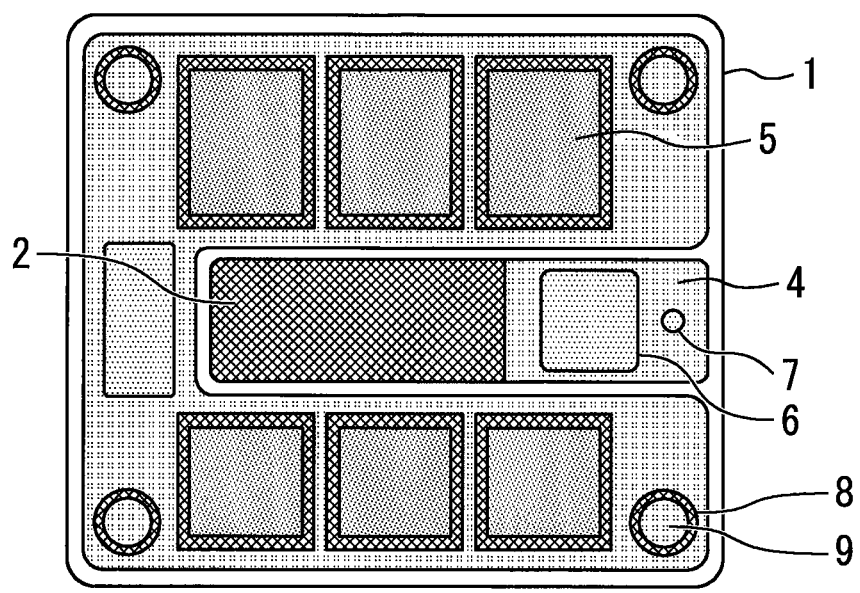
FIG. 3 is a plan view showing a semiconductor module according to a second embodiment.

FIG. 3 is a plan view showing a semiconductor module according to a second embodiment. In the present embodiment, the sucked areas 9 are provided at each of four corners of the insulating substrate 1. By providing the plurality of sucked areas 9 on the insulating substrate 1 as described above, stability during the conveyance of the insulating substrate 1 can be enhanced.

Third Embodiment

Figure 4:
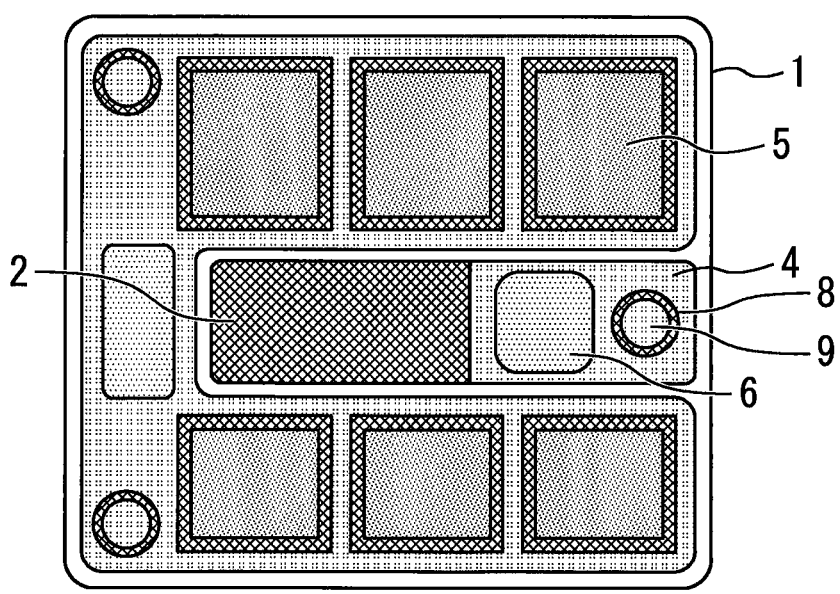
FIG. 4 is a plan view showing a semiconductor module according to a third embodiment.

FIG. 4 is a plan view showing a semiconductor module according to a third embodiment. In the present embodiment, the sucked area 9 is provided to be adjacent to the terminal bonding plating 6. As a result, the sucked area 9 can be used as a position recognition mark. Therefore, the degree of freedom in design can be increased while saving space.

The semiconductor chip 5 is an IGBT or a diode, but may be a MOSFET, SBD or the like. The semiconductor chip 5 is not limited to semiconductor chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor module in which the semiconductor chip is incorporated. Further, since the semiconductor chip has a high heat resistance, a radiation fin of a heatsink can be miniaturized and a water-cooled part can be air-cooled, which leads to further miniaturization of the semiconductor module.

REFERENCE SIGNS LIST 1 insulating substrate; 2 metal pattern; 4 solder resist; 5 semiconductor chip; 7 position recognition mark; 8 groove; 9 suction area; 10 sealing material

The invention claimed is:

1. A semiconductor module comprising:
an insulating substrate;
a metal pattern provided on the insulating substrate;
a solder resist provided on the metal pattern;
a semiconductor chip mounted on the metal pattern at an opening portion of the solder resist; and
a sealing material sealing the metal pattern, the solder resist and the semiconductor chip,
wherein a suction area surrounded by a groove is provided in a portion of the solder resist.

2. The semiconductor module according to claim 1, wherein a diameter of the suction area is not less than 3 mm and not more than 10 mm.

3. The semiconductor module according to claim 1, wherein the suction area includes a plurality of suction areas provided on the insulating substrate.

4. The semiconductor module according to claim 1, further comprising a terminal bonding plating provided on the metal pattern,
wherein the suction area is provided to be adjacent to the terminal bonding plating.

5. The semiconductor module according to claim 1, wherein the semiconductor chip is made of a wide-band-gap semiconductor.

6. The semiconductor module according to claim 2, wherein the suction area includes a plurality of suction areas provided on the insulating substrate.

7. The semiconductor module according to claim 2, further comprising a terminal bonding plating provided on the metal pattern,
wherein the suction area is provided to be adjacent to the terminal bonding plating.

8. The semiconductor module according to claim 3, further comprising a terminal bonding plating provided on the metal pattern,
wherein the suction area is provided to be adjacent to the terminal bonding plating.

9. The semiconductor module according to claim 6, further comprising a terminal bonding plating provided on the metal pattern,
wherein the suction area is provided to be adjacent to the terminal bonding plating.

10. The semiconductor module according to claim 2, wherein the semiconductor chip is made of a wide-band-gap semiconductor.

11. The semiconductor module according to claim 3, wherein the semiconductor chip is made of a wide-band-gap semiconductor.

12. The semiconductor module according to claim 4, wherein the semiconductor chip is made of a wide-band-gap semiconductor.

13. The semiconductor module according to claim 6, wherein the semiconductor chip is made of a wide-band-gap semiconductor.

14. The semiconductor module according to claim 7, wherein the semiconductor chip is made of a wide-band-gap semiconductor.

15. The semiconductor module according to claim 8, wherein the semiconductor chip is made of a wide-band-gap semiconductor.

16. The semiconductor module according to claim 9, wherein the semiconductor chip is made of a wide-band-gap semiconductor.

* * * * *